(12) United States Patent
Yokomizo (10) Patent No.: US 6,271,779 B1
(45) Date of Patent: Aug. 7, 2001

(54) CURRENT CELL AND DIGITAL-ANALOG CONVERTER

(75) Inventor: Koichi Yokomizo, Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 09/433,868

(22) Filed: Nov. 4, 1999

(30) Foreign Application Priority Data

Nov. 4, 1998 (JP) .................................................. 10-313542

(51) Int. Cl.[7] ...................................................... H03M 1/66
(52) U.S. Cl. ............................................ 341/136; 341/144
(58) Field of Search .................................. 341/136, 144, 341/153

(56) References Cited

U.S. PATENT DOCUMENTS

| | | | |
|---|---|---|---|
| 4,393,370 | * | 7/1983 | Hareyama .............................. 341/136 |
| 5,331,322 | * | 7/1994 | Cha et al. ............................. 341/136 |
| 5,452,014 | | 9/1995 | Manley . |
| 6,100,830 | * | 8/2000 | Dedic .................................... 341/136 |

FOREIGN PATENT DOCUMENTS 7-221642  8/1995  (JP) .

* cited by examiner

Primary Examiner—Howard L. Williams
(74) Attorney, Agent, or Firm—Jones Volentine, PLLC (57) ABSTRACT

An output unit includes a constant current source, a switching transistor that dumps the constant current when a first signal is low, and a switching transistor that outputs the constant current when a second signal is low. A drive unit includes an inverter that generates the first signal responsive to a digital signal, and an inverter that generates the second signal responsive to the digital signal inverted. Power supply terminals of the inverters are connected to an output of the current source, and the high-level voltage of the digital signal is higher than the high-level voltage at the power supply terminals. Accordingly, operation timing of the inverters is slower when changing from high level to low level, than when changing from low level to high level, so that the switching transistors do not both turn off simultaneously. This suppresses current fluctuations of the current source.

26 Claims, 4 Drawing Sheets

CURRENT CELL AND DIGITAL-ANALOG CONVERTER

BACKGROUND OF THE INVENTION

1. Field of the Invention

This invention relates to current cells and to a digital-analog converter (DAC) wherein those current cells are used. A DAC outputs electrical currents according to numerical values indicated by digital signals. DACs are employed, for example, in integrated circuits and the like for processing video signals.

2. Description of Related Art

One known current cell used in DACs is the current cell described in U.S. Pat. No. 5,452,014.

As noted in this U.S. patent, a current cell, in principle, comprises one current source and two switches. One switch is a switch that controls current dumping, which is used for making and breaking connections between a constant current source and ground. The other switch is a switch that controls current output, which is used for making and breaking connection between the current source and a current output terminal. When the current dumping switch is closed and the current output switch is open, the current output from the current source is dumped to ground. When, on the other hand, the current dumping switch is open and the current output switch is closed, the current output from the current source is output from the current output terminal to the outside.

Switching transistors can be used for these two switches. In current cells wherein switching transistors are used, there are cases where the transistors are not in a completely on state at exactly the same time. In such cases, the current source cannot output currents at the design values, for which reason the output voltage of the current source rises abnormally. Accordingly, when, subsequent thereto, one of the switching transistors attains a completely on state, a very large current flows to that switching transistor. Parasitic inductance is present in integrated circuit lead wires and in patterns printed on circuit boards. For that reason, large current fluctuations cause cross-shorting and ringing, etc. In DACs mounted in integrated circuits used for video signal processing, cross-shorting and ringing cause deterioration in picture quality.

SUMMARY OF THE INVENTION

A first object of the present invention is to provide a current cell wherein current fluctuations in the constant current supply are suppressed.

A second object of the present invention is to provide a DAC wherewith the occurrence of cross-shorting and ringing can be prevented.

A current cell according to a first invention comprises: constant current supply means connected to a first power supply line; first switching means for dumping currents input from the constant current supply means when a first selection signal is at the on level, via an internal node, to a second power supply line; second switching means for outputting currents input from the constant current supply means when a second selection signal is at the on level, via the internal node, to the outside; first selection means for generating the first selection signal by inverting a digital signal, which are driven by potential differences appearing between the internal node and the second power supply line; and second selection means for generating the second selection signal by inverting an inverted digital signal, which are driven by potential differences appearing between the internal node and the second power supply line.

In the first invention, the first and second selection means are activated by potential differences between the internal node and the second power supply line. Accordingly, the activation timing for the first and second selection means is slower when changing from the on level to the off level than when changing from the off level to the on level. For that reason, the first and second selection means will not turn off simultaneously, wherefore current fluctuations in the constant current source are suppressed.

A digital-analog converter according to a second invention comprises: decoder means for converting a plurality of data bits to a plurality of digital signals; a plurality of current cells that comprise: constant current supply means connected to a first power supply line; first switching means for dumping currents input from the constant current supply means when a first selection signal is at the on level, via an internal node, to a second power supply line; second switching means for outputting currents input from the constant current supply means when a second selection signal is at the on level, via the internal node, to the outside; first selection means for generating the first selection signal by inverting a digital signal, which are driven by potential differences appearing between the internal node and the second power supply line; and second selection means for generating the second selection signal by inverting an inverted digital signal, which are driven by potential differences appearing between the internal node and the second power supply line; and an output terminal for outputting the sum of the currents output by the current cells.

The digital-analog converter according to the second invention employs current cells wherein the current from the constant current source is stable, wherefore the occurrence of cross-shorting and ringing can be prevented.

BRIEF DESCRIPTION OF THE DRAWINGS

Other objects and advantages of the present invention will be described with reference to the following attached drawings.

DESCRIPTION OF THE PREFERRED EMBODIMENTS

Embodying aspects of the present invention are now described using the drawings. In the drawings, the sizes, shapes, and deployment relationships are represented in simplified form and only to such extent as will allow the present invention to be comprehended, and the numerical conditions described in the following are merely given as examples.

First Embodiment

A current cell that relates to a first embodying aspect is now described with reference to FIG. 1 and FIG. 2.

Figure 1:
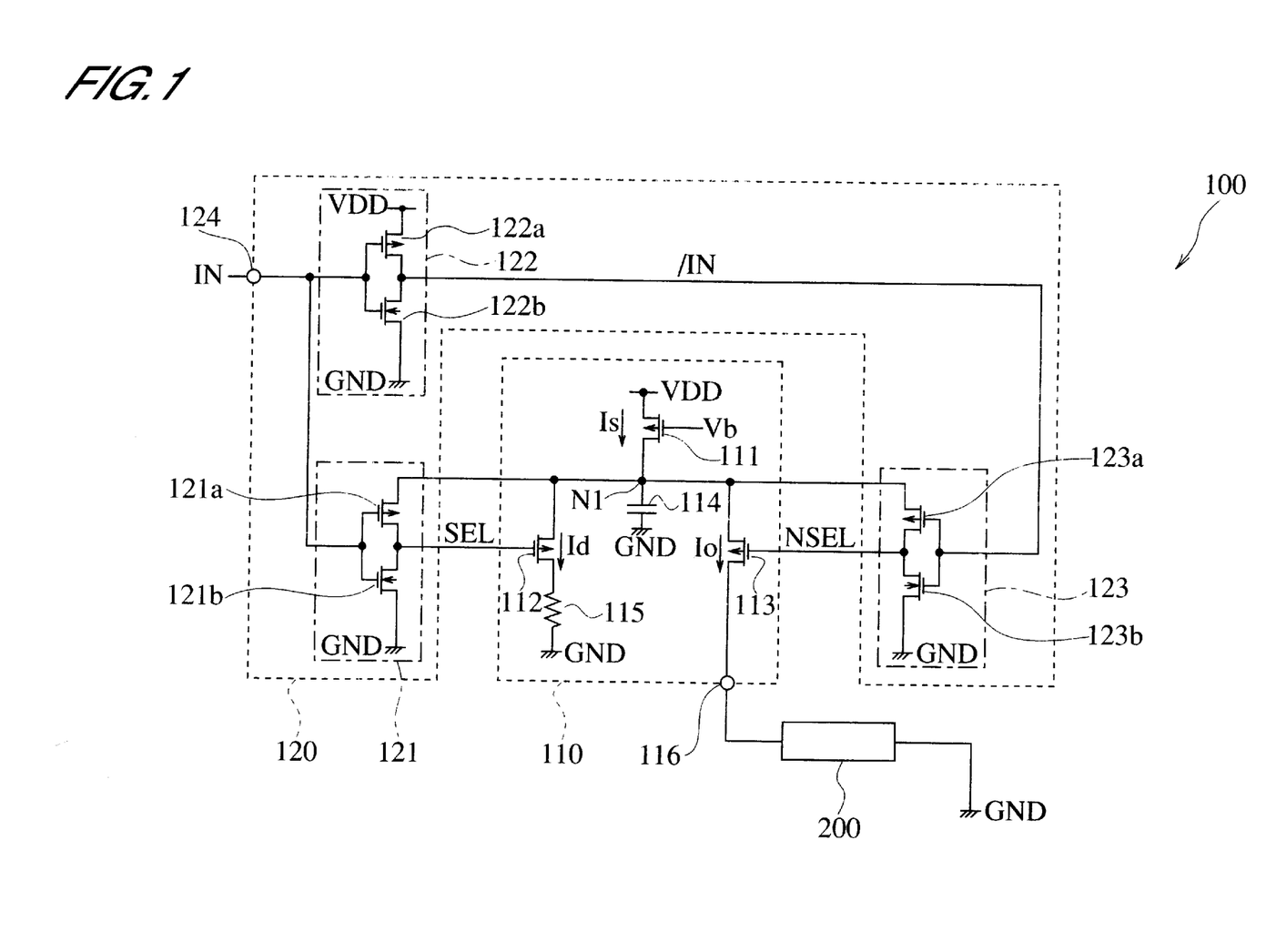
FIG. 1 is a schematic diagram representing the configuration of a current cell according to an embodying aspect of the present invention.

As diagrammed in FIG. 1, this current cell 100 comprises an output unit 110 and a drive unit 120.

The output unit 110 comprises a constant current source, a switch for controlling current dumping, and a switch for controlling current output. In this embodying aspect, a pMOS transistor 111 is used for the constant current source, a pMOS transistor 112 is used for the current dumping switch, and a pMOS transistor 113 is used for the current output switch. The output unit 110 comprises a capacitor 114 for suppressing current fluctuations in the constant current source 111 and a resistor 115 for preventing the dumped current from becoming excessive. The output unit 110 also comprises an output terminal 116 for supplying current to a load 200.

To the source of the pMOS transistor 111 is input the power supply potential VDD. To the gate of the pMOS transistor 111 is input a bias potential Vb. Such design conditions as the gate length and gate width like in the PMOS transistor 111 are determined so that the drain current will become saturated when the gate-source voltage is Vb. The saturated drain current is output from the pMOS transistor 111 as a constant current Is.

The source of the pMOS transistor 112 is connected to the drain of the pMOS transistor 111 at a node N1. To the gate of the pMOS transistor 112 is input a selection signal SEL.

The source of the pMOS transistor 113 is connected to the drain of the pMOS transistor 111 at the node N1. To the gate of the pMOS transistor 113 is input a selection signal NSEL.

One end of the capacitor 114 is connected to the drain of the pMOS transistor 111 at the node N1, and the other end of the capacitor 114 is connected to a ground line GND.

One end of the resistor 115 is connected to the drain of the pMOS transistor 112, and the other end of the resistor 115 is connected to the ground line GND.

The output terminal 116 is connected to the drain of the pMOS transistor 113 and to the load 200.

The drive unit 120 comprises three inverters 121, 122, and 123. The drive unit 120 also comprises an input terminal 124 in order to input a digital signal IN from the outside.

The inverter 121 comprises a pMOS transistor 121a and an nMOS transistor 121b. The source of the pMOS transistor 121a is connected to the drain of the pMOS transistor 111 at the node N1. The source of the nMOS transistor 121b is connected to the ground line GND. The gates of the MOS transistors 121a and 121b are connected to the input terminal 124. The drains of the MOS transistors 121a and 121b are connected to each other. The potential at the point of connection between these two drains is applied to the gate of the pMOS transistor 112 as the selection signal SEL. The logical value of the selection signal SEL is the inverse of the digital signal IN.

The inverter 122 comprises a pMOS transistor 122a and an nMOS transistor 122b. To the source of the pMOS transistor 122a is input the power supply potential VDD. The source of the nMOS transistor 122b is connected to the ground line GND. The gates of the MOS transistors 122a and 122b are connected to the input terminal 124. The drains of the MOS transistors 122a and 122b are connected to each other. The potential at the point of connection between these drains becomes the output signal /IN from the inverter 122. The logical value of the signal /IN is the inverse of the digital signal IN.

The inverter 123 comprises a PMOS transistor 123a and an nMOS transistor 123b. The source of the PMOS transistor 123a is connected to the drain of the pMOS transistor 111 at the node N1. The source of the nMOS transistor 123b is connected to the ground line GND. To the gates of the MOS transistors 123a and 123b are input the signal /IN from the inverter 122. The drains of the MOS transistors 123a and 123b are connected to each other. The potential at the point of connection between these drains is applied to the gate of the pMOS transistor 113 as the selection signal NSEL. The logical value of the selection signal NSEL becomes the same as that of the digital signal IN and, consequently, the inverse of the selection signal SEL.

The operation of the inverters 121 and 123 is now described.

In the current cell of this embodying aspect, the high level of the input potential IN at the inverter 121 is set so that it is higher than the power supply potential at the inverter 121 (the potential at the node N1). Similarly, the high level of the input potential IN at the inverter 123 is set so that it is higher than the power supply potential at the inverter 123 (the potential at the node N1).

In the description that follows, the power supply potential VDD is assumed to be 3.3 volts and the potential at the node N1 is assumed to be 2.1 volts. In the following description, furthermore, the high level of the digital signal IN is assumed to be 3.3 volts and the low level of the signal IN is assumed to be zero volts.

Because the high level of the digital signal IN is 3.3 volts, the high level of the input potential at the inverter 121 will be 3.3 volts. Also, because the power supply potential VDD is 3.3 volts, the high level of the output potential at the inverter 122 will be 3.3 volts, and, accordingly, the high level of the input potential at the inverter 123 will also be 3.3 volts. Because the node N1 is at 2.1 volts, the high level of the output potential of the inverters 121 and 123 will also be 2.1 volts. The low level of the output potential of the inverters 121 and 123 will be substantially the same as the ground potential, that is, zero volts.

The inverters 121 and 123 output a high level (2.1 volts) when the input potential is at low level (zero volts). When the input potential begins rising from zero volts, the output potentials of the inverters 121 and 123 gradually decline. When the input potential reaches 2.1 volts, the outputs of the inverters 121 and 123 reach low level (zero volts). During the interval from the time that the input potential first exceeds 2.1 volts until it reaches high level (3.3 volts), the outputs from the inverters 121 and 123 are maintained at low level.

When the input potential is at high level (3.3 volts), on the other hand, the inverters 121 and 123 output the low level (zero volts). While the input potential is dropping from 3.3 volts to 2.1 volts, the output potential of the inverters 121 and 123 is maintained at low level. When the input potential reaches 2.1 volts, the output from the inverters 121 and 123 begins to rise. When the input potential reaches the low level, the output of the inverters 121 and 123 reaches the high level.

Figure 2:
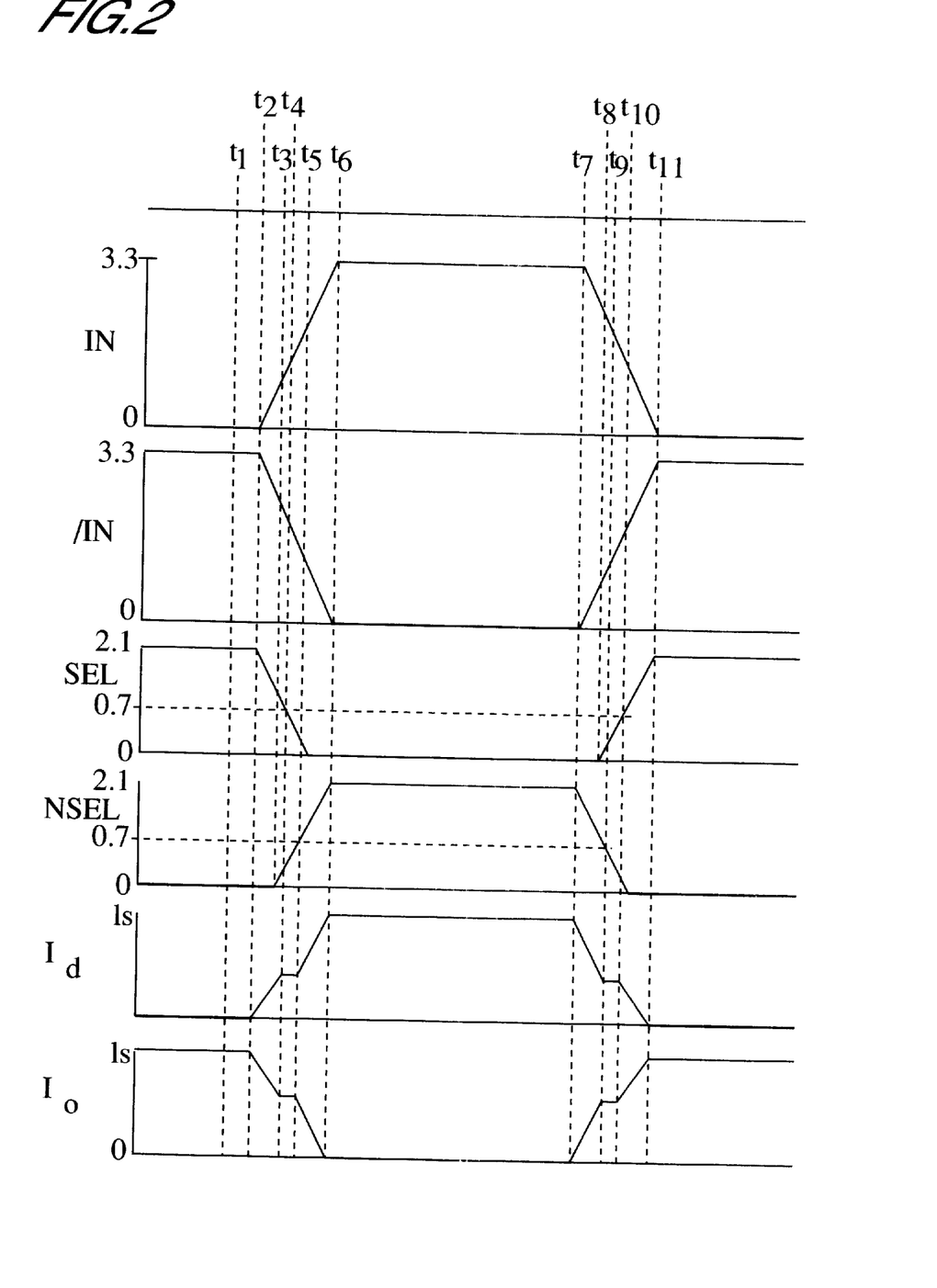
FIG. 2 is a signal waveform diagram for describing the operation of the current cell diagrammed in FIG. 1.

The overall operation of the current cell 100 is now described using FIG. 2.

The operation of the current cell 100 when the digital signal IN is changing from low level to high level is described first.

At time t1, the digital signal IN is at low level, wherefore the output signal /IN from the inverter 122 is at high level. At this time, the inverter 121 outputs a high level as a selection signal SEL, and the inverter 123 outputs a low level as a selection signal NSEL. Accordingly, the pMOS transistor 112 turns off and the pMOS transistor 113 turns on. As a consequence, the drain current Id of the pMOS transistor 112 is zero amperes, and the drain current Io of the pMOS transistor 113 is substantially identical to the output current Is of the pMOS transistor 111. Accordingly, the sum of the currents Id and Io coincides with the current Is.

At time t2, the potential of the signal IN begins rising from low level to high level. At this time, the potential of the signal /IN begins falling from high level to low level. Accordingly, the selection signal SEL begins declining from the high level and the selection signal NSEL is maintained at the low level. Since the selection signal SEL is starting to decline, the drain current Id of the pMOS transistor 112 starts rising. During the interval from time t2 to time t3, the drain current Io of the pMOS transistor 113 decreases in response to the rise in the current Id, but the sum of the currents Id and Io is maintained at Is.

At time t3, the potential of the signal /IN reaches 2.1 volts. At this time, the selection signal NSEL begins rising from the low level.

At time t4, the selection signal SEL is declining and reaches the threshold voltage Vth (0.7 volts, for example) of the pMOS transistor 112. This causes the pMOS transistor 112 to be in an on state. At this time, the selection signal NSEL is lower than the threshold voltage Vth, wherefore the pMOS transistor 113 is also on. When both pMOS transistors 112 and 113 are turned on, the current Is branches into the currents Id and Io. At this time, the sum of the currents Id and Io coincides with the current Is.

At time t5, the selection signal NSEL is rising and reaches the threshold voltage Vth (0.7 volts, for example) of the pMOS transistor 113. This causes the pMOS transistor 113 to be in an off state. When the pMOS transistor 113 turns off, the drain current Io decreases in response to the rise in the selection signal NSEL. However, because the pMOS transistor 112 is turned on, the current Id increases by the measure that the current Io decreases. Accordingly, the sum of the currents Id and Io is maintained at Is. After that, when the signal IN has reached 2.1 volts, the selection signal SEL reaches zero volts.

At time t6, the signal IN completely attains high level, that is, 3.3 volts. The signal /IN reaches zero volts, and, in correspondence therewith, the selection signal NSEL completely reaches high level, that is, 2.1 volts. When the selection signal NSEL completely reaches the high level, the drain current of the pMOS transistor 113 becomes zero amperes. That causes the current cell 100 to be in a stable state. All of the current Is is then dumped to ground, via the pMOS transistor 112 and the resistor 115. At that time, the current Id coincides with Is.

The operation of the current cell 100 when the digital signal IN changes from high level to low level is described next.

At time t7, the potential of the signal IN begins falling from high level to low level. At this time, the potential on the signal /IN begins rising from low level to high level. Accordingly, the selection signal NSEL begins declining from high level, and the selection signal SEL is maintained at low level. Because the selection signal NSEL has begun falling, the drain current Io of the pMOS transistor 113 begins rising. During the interval from time t7 to time t8, the drain current Id of the pMOS transistor 113 decreases, in response to the rise in the current Io, but the sum of the currents Id and Io is maintained at Is.

At time t8, the potential of the signal IN reaches 2.1 volts. At this time, the selection signal SEL begins rising from the low level.

At time t9, the selection signal NSEL is declining, and reaches the threshold voltage Vth (0.7 volts, for example) of the pMOS transistor 113. This causes the pMOS transistor 113 to be in the on state. At this time, the selection signal SEL is lower than the threshold voltage Vth, wherefore the pMOS transistor 112 is also turned on. When both of the pMOS transistors 112 and 113 are turned on, the current Is branches into the currents Id and Io. At this time the sum of the currents Id and Io coincides with the current Is.

At time t10, the selection signal SEL is rising, and reaches the threshold voltage Vth (0.7 volts, for example) of the pMOS transistor 112. This causes the pMOS transistor 112 to be in an off state. When the pMOS transistor 112 turns off, the drain current Id decreases in response to the rise in the selection signal SEL. However, because the pMOS transistor 113 is turned on, the current Io increases by the measure that the current Id decreases. Accordingly, the sum of the currents Id and Io is maintained at Is. After that, when the signal /IN has reached 2.1 volts, the selection signal NSEL reaches zero volts.

At time t11, the signal IN completely reaches the low level of zero volts and, in correspondence therewith, the selection signal SEL completely reaches the high level of 2.1 volts. When the selection signal SEL completely reaches the high level, the drain current of the pMOS transistor 112 becomes zero amperes. This causes the current cell 100 to be in a stable state. All of the current Is is then supplied to the load 200, via the pMOS transistor 113 and the output terminal 116. At this time, the current Io coincides with Is.

As described in the foregoing, in the current cell 100 of this embodying aspect, the high level of the input potential at the gates of inverters 121 and 123 is higher than the power supply potential at the inverters 121 and 123 (i.e. than the potential at the node N1). For this reason, a difference in timing is produced between the change in the selection signal SEL and the change in the selection signal NSEL when the level of the digital signal IN is changing. Because of this difference in timing, the inverter 121 and the inverter 123 will not turn off simultaneously. That being the case, the output current Is from the power supply transistor 111 will be maintained at a constant level, and the output voltage from the transistor 111 will not rise abnormally. Hence no large currents will flow to either the transistor 112 or the transistor 113 when either of the switching transistors 112 and 113 is in a completely on state, so no cross-shorting or ringing will occur.

Second Embodiment

Figure 3:
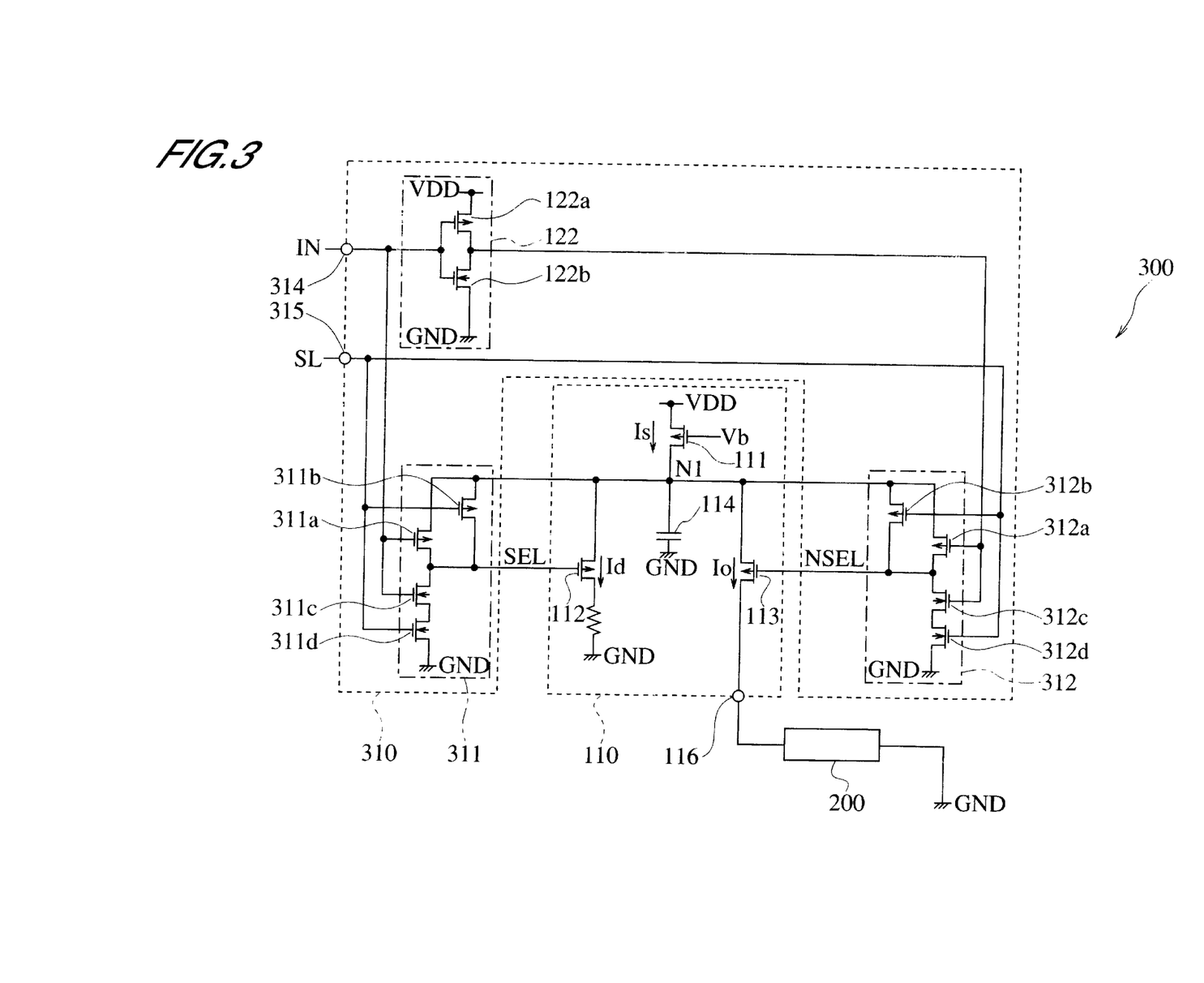
FIG. 3 is a schematic diagram representing the configuration of a current cell according to a second embodying aspect of the present invention.

A current cell relating to a second embodying aspect is now described using FIG. 3.

As diagrammed in FIG. 3, this current cell 300 comprises an output unit 110 and a drive unit 310.

The internal configuration of the output unit 110 is the same as the output unit indicated in the first embodying aspect, wherefore no further description is given here.

The drive unit 310 comprises two NAND gates 311 and 312, and one inverter 122. The drive unit 310 also comprises an input terminal 314 for inputting a digital signal IN and an input terminal 315 for inputting a slave signal SL for drive control.

The internal configuration of the inverter 122 is the same as that of the inverter 122 indicated in the first embodying aspect, wherefore no further description is given here.

The NAND gate 311 comprises PMOS transistors 311*a* and 311*b*, and nMOS transistors 311*c* and 311*d*. The sources of the pMOS transistors 311*a* and 311*b* are connected to the drain of the pMOS transistor 111 at the node N1. The drains of the pMOS transistors 311*a* and 311*b* are connected to the drains of the nMOS transistor 311*c*, while the source of the nMOS transistor 311*c* is connected to the drain of the nMOS transistor 311*d*. The source of the nMOS transistor 311*d* is connected to a ground line GND. The gates of the MOS transistors 311*a* and 311*c* are connected to the input terminal 314, while the gates of the MOS transistors 311*b* and 311*d* are connected to the input terminal 315. The potential at the point of connection between the drains of the MOS transistors 311a, 311b, and 311c is applied as a selection signal SEL to the gate of the pMOS transistor 112.

The NAND gate 312 comprises pMOS transistors 312a and 312b, and nMOS transistors 312c and 312d. The sources of the pMOS transistors 312a and 312b are connected to the drain of the pMOS transistor 111 at the node N1. The drains of the pMOS transistors 312a and 312b are connected to the drain of the nMOS transistor 312c, while the source of the nMOS transistor 312c is connected to the drain of the nMOS transistor 312d. The source of the nMOS transistor 312d is connected to the ground line GND. To the gates of the MOS transistors 312a and 312c are input output signals from the inverter 122. The gates of the MOS transistors 312b and 312d are connected to the input terminal 315. The potential at the point of connection between the MOS transistors 312a, 312b, and 312c is applied as a selection signal NSEL to the gate of the PMOS transistor 113.

The operation of the current cell 300 is now described.

When the current cell 300 is not being used, the slave signal SL is set at low level. At such time, the pMOS transistors 311b and 312b will turn on and the nMOS transistors 311c and 312c will turn off, wherefore the outputs SEL and NSEL from the NAND gates 311 and 312 will go high irrespective of the level of the digital signal IN. Accordingly, the PMOS transistors 112 and 113 will turn off, wherefore the output unit 110 will not operate.

When the current cell 300 is used, on the other hand, the slave signal SL is set at high level. At such time, the pMOS transistors 311b and 312b will be fixed in the off state, and the nMOS transistors 311c and 312c will be fixed in the on state. The on and off states of the pMOS transistors 311a and 312a and the nMOS transistors 311c and 312c change according to the level of the digital signal IN. That is, when the slave signal SL is at high level, the circuit configuration of the NAND gates 311 and 312 is equivalent to the circuit configuration of the inverters 121 and 123 diagrammed in FIG. 1. That being so, when the slave signal SL is at the high level, the operation of the current cell 300 is the same as the operation of the current cell 100 (cf. FIG. 2).

With the current cell 300 in this embodying aspect, the pMOS transistors 112 and 113 can be turned off when the current cell 300 is not operating, making it possible to reduce power consumption. The same benefits are realized as with the first embodying aspect in terms of being able to prevent the occurrence of cross-shorting and ringing, etc.

Third Embodiment

Figure 4:
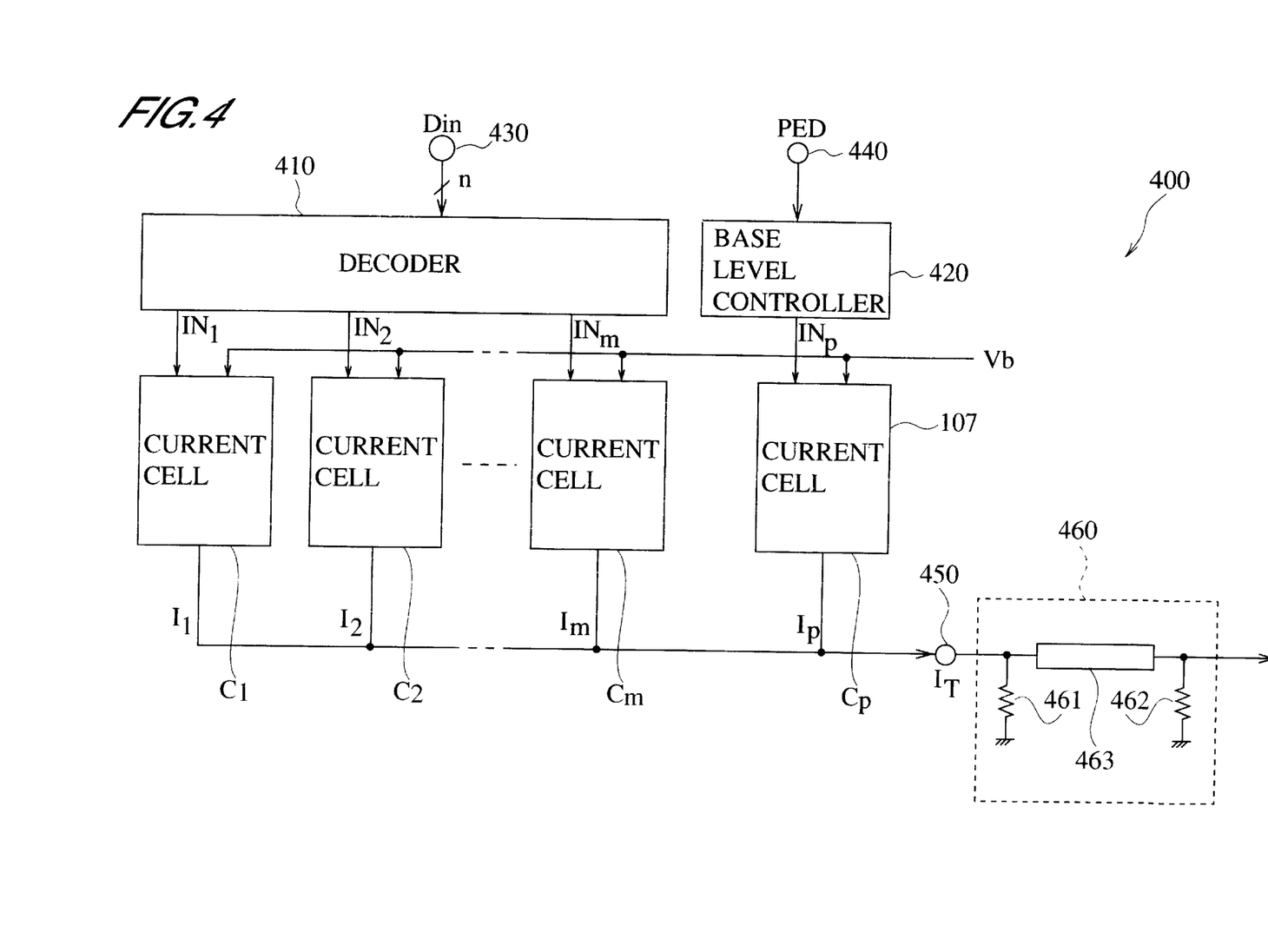
FIG. 4 is a block diagram representing the configuration of a DAC according to an embodying aspect of the present invention.

In a third embodying aspect, an embodying aspect of a DAC relating to the present invention is described using FIG. 4.

As diagrammed in FIG. 4, a DAC 400 comprises a decoder 410 as data decoding means, a base level controller 420, current cells $C_1$ to $C_m$ and $C_p$ numbering m+1, an input terminal 430 for inputting data Din, an input terminal 440 for inputting a control signal PED, and an output terminal 450 for outputting current. The output terminal 450 is connected to an external transmission line 460 which acts as a load.

The decoder 410 inputs n bits of data Din via the input terminal 430 and outputs m ($m=2^n-1$) digital signals $IN_1$ to $IN_m$. If the value indicated by the data Din is represented by x, the decoder 410 forces the first x digital signals $IN_1, \ldots, IN_x$ to the low level, and forces the remaining digital signals $IN_{x+1}, \ldots, IN_m$ to the high level. The digital signals $IN_1$ to $IN_m$ are sent respectively to corresponding current cells $C_1$ to $C_m$.

The base level controller 420, when one bit of the control signal PED has been input thereby via the input terminal 440, outputs a low level signal as the digital signal $IN_p$. When the controller 420 does not have the signal PED input thereto, the digital signal $IN_p$ goes to the high level. As will be described subsequently, the controller 420, when it has input thereto a control signal PED, controls the current cell $C_p$, and superimposes a pedestal level on the output current $I_T$ of the DAC.

The internal configuration of each of the current cells $C_1$ to $C_m$ and $C_p$ is the same as the internal configuration of the current cell 100 diagrammed in FIG. 1.

The current cells $C_1$ to $C_m$ have input thereto digital signals $IN_1$ to $IN_m$ and a bias voltage Vb. The current cells $C_1$ to $C_m$, when the corresponding digital signals are at the low level, output the currents $I_1$ to $I_m$. When the corresponding digital signals are at the high level, the current cells $C_1$ to $C_m$ do not output current. The values of the currents $I_1$ to $I_m$ are all identical. For the description that follows, these values are defined as $I_1=I_2=\ldots=I_m=I_o$.

The current cell $C_p$, on the other hand, has input thereto the digital signal $IN_p$ and the bias voltage Vb. The current cell $C_p$, when the digital signal $IN_p$ is at the low level, outputs the current $I_p$. When the digital signal $IN_p$ is at the high level, the current cell $C_p$ does not output current. The value of the current $I_p$ becomes that of the pedestal level superimposed on the output current $I_T$. The value of the current $I_p$ does not need to be identical to Io. The output currents from the current cells can be set by the sizes of the gate length and gate width, etc., of the pMOS transistor 111 (cf. FIG. 1).

The output terminal 450 outputs a current $I_T$ that is the sum of the currents output by the current cells $C_1$ to $C_m$ and $C_p$. The current $I_T$ is supplied to the transmission line 460.

The transmission line 460 has terminal resistors 461 and 462 and a coaxial cable 463.

The operation of the DAC diagrammed in FIG. 4 is described next, taking an example case where Din=6.

First, when data Din are input to the input terminal 430, the decoder 410 forces the digital signals $IN_1$ to $IN_6$ to low level, and the digital signals $IN_7$ to $IN_m$ to high level. Thus the current cells $C_1$ to $C_6$ output currents $I_1$ to $I_6$ and the current cells $C_7$ to $C_m$ do not output current.

At this time, if no control signal PED has been input from the input terminal 440, the controller 420 forces the level of the digital signal $IN_p$ to high, and the current cell $C_p$ does not output current. Accordingly, the value of the current $I_T$ output from the output terminal 450 becomes six time Io. That is, the DAC 400 outputs a current corresponding to the value of the data Din.

If, on the other hand, a control signal PED has been input from the input terminal 440, the controller 420 forces the level of the digital signal $IN_p$ to low. This causes the current cell $C_p$ to output the current $I_p$. Accordingly, the value of the current $I_T$ output from the output terminal 450 becomes 6×Io+$I_p$. That is, the DAC 400 outputs a current corresponding to the value of the data Din after superimposing the pedestal level $I_p$.

When the value of the data Din changes, the current cells $C_1$ to $C_m$ switch between current output and current dumping in correspondence with those changes. For this reason, the value of the output current $I_T$ from the DAC 400 varies according to the value of the data Din. In the DAC 400 relating to this embodying aspect, the structure diagrammed in FIG. 1 is adopted for the internal structure of the current cells $C_1$ to $C_m$. Therefore, when the value of the data Din changes, the value of the output current $I_T$ changes smoothly, and no sudden changes occur. In addition, in the DAC 400, the structure diagrammed in FIG. 1 is adopted as the internal structure of the current cell $C_p$, wherefore no sudden changes will occur in the output current $I_T$ even when the level of the signal PED changes.

For those reasons, neither cross-shorting nor ringing readily occurs in the DAC 400. When the DAC 400 is mounted in an integrated circuit used for video signal processing, the generation of cross-shorting and ringing is suppressed, wherefore picture quality does not readily deteriorate.

The present invention is not limited to or by the first, second, and third embodying aspects described in the foregoing.

For example, the internal structure of the current cell 300 diagrammed in FIG. 3 can be adopted for the internal structure of the current cells $C_1$ to $Cm$ and $C_p$ indicated in FIG. 4.

In FIG. 1 and FIG. 3, in cases where fluctuation in the potential at the node N1 can be disregarded because the output current Is of the pMOS transistor 111 is very small, the capacitor 114 is unnecessary. This current cell can be adopted in the DAC of the present invention.

Instead of the capacitor 114, in FIG. 1 and FIG. 3, a pMOS transistor can be used with the gate connected to the node N1 and the power supply potential VDD applied to the drain and the source. This current cell can be adopted in the DAC of the present invention.

In FIG. 4, the output currents $I_1$, to $I_m$ of the current cells $C_1$ to $C_m$ need not be identical. It is possible to employ current values that are compounded in such fashion as $I_1$=Io, $I_2$=2Io, and $I_3$=4Io, for example. When the values of the currents $I_1$ to $I_m$ are compounded, the number of current cells can be decreased without altering the output range or output current resolving power of the DAC. The decoder logic is modified according to the way in which compounding is implemented.

In the embodying aspects described in the foregoing, the current cells are configured so that current is output when the digital signal level is low and current is dumped when the digital signal level is high. However, in cases where the digital signal logic is reversed, that is, where current is output when the digital signal level is high and current is dumped when the digital signal level is low, the inverter 122 is positioned between the input terminal 124 and the inverter 121.

What is claimed is:

1. A current cell comprising:
   a constant current supply, connected to a first power supply line, that outputs a constant current to an internal node;
   a first switch that dumps current input form said constant current supply when a first selection signal is at an on level, via said internal node, to a second power supply line;
   a second switch that outputs current input from said constant current supply when a second selection signal is at an on level, via said internal node;
   a first selector that generates said first selection signal by inverting an input signal, and which is driven by potential differences appearing between said internal node and said second power supply line; and
   a second selector that generates said second selection signal by inverting an inverted signal of the input signal, and which is driven by potential differences appearing between said internal node and said second power supply line,
   a potential of said internal node being set to be lower than a high level potential of the input signal and the inverted signal, so that said first switch and said second switch simultaneously assume an on state when a potential level of the input signal changes.

2. The current cell according to claim 1, wherein said constant current supply is a transistor circuit having one terminal connected to said first power supply line, another terminal connected to said internal node, and a control terminal coupled to a bias voltage.

3. The current cell according to claim 1, wherein said first switch has a transistor circuit having one terminal connected to said internal node, another terminal connected via a resistor to said second power supply line, and a control terminal coupled to said first selection signal.

4. The current cell according to claim 1, wherein said second switch has a transistor circuit having one terminal connected to said internal node, another terminal connected to a current output terminal, and a control terminal coupled to said second selection signal.

5. The current cell according to claim 1, wherein said first selector comprises an inverter including:
   a first transistor of one conductive type, having one terminal connected to said internal node, and a control terminal which is coupled to the input signal; and
   a second transistor of another conductive type, having one terminal connected to said second power supply line, another terminal connected to another terminal of said first transistor, and a control terminal which is coupled to the input signal from the control terminal.

6. The current cell according to claim 1, wherein said first selector comprises a NAND gate including:
   a first transistor of one conductive type, having one terminal connected to said internal node, and a control terminal which is coupled to the input signal;
   a second transistor of the one conductive type, having one terminal connected to said internal node, and a slave terminal which is coupled to a slave signal;
   a third transistor of another conductive type, having one terminal connected to said second power supply line, and a slave terminal which is coupled to the slave signal; and
   a fourth transistor of the other conductive type, having one terminal connected to another terminal of said third transistor, another terminal connected to another terminal of said first transistor and to another terminal of said second transistor, and a control terminal which is coupled to the input signal.

7. The current cell according to claim 1, wherein said second selector comprises an inverter including:
   a first transistor of one conductive type, having one terminal connected to said internal node, and a control terminal which is coupled to the inverted signal; and
   a second transistor of another conductive type, having one terminal connected to said second power supply line, another terminal connected to another terminal of said first transistor, and a control terminal which is coupled to the inverted signal.

8. The current cell according to claim 1, wherein said second selector comprises a NAND gate including:
   a first transistor of one conductive type, having one terminal connected to said internal node, and a control terminal which is coupled to the inverted signal;
   a second transistor of the one conductive type, having one terminal connected to said internal node, and a slave terminal which is coupled to a slave signal;

a third transistor of another conductive type, having one terminal connected to said second power supply line, and a slave terminal which is coupled to the slave signal; and a fourth transistor of the another conductive type, having one terminal connected to another terminal of said third transistor, another terminal connected to another terminal of said first transistor and to another terminal of said second transistor, and a control terminal which is coupled to the input signal.

9. The current cell according to claim 1, further comprising a converter that generates the inverted signal based on the input signal, and which is driven by potential differences arising between said first power supply line and said second power supply line.

10. The current cell according to claim 9, comprising:

a first transistor of one conductive type, having one terminal connected to said first power supply line, and a control terminal which is coupled to the input signal; and a second transistor of another conductive type, having one terminal connected to said second power supply line, another terminal connected to another terminal of said first transistor, and a control terminal which is coupled to the input signal from a control terminal.

11. The current cell according to claim 1, further comprising a stabilizer that stabilizes potential at said internal node.

12. The current cell according to claim 11, wherein said stabilizer comprises a capacitor having one end connected to said internal node and another end connected to said second power supply line.

13. The current cell according to claim 11, wherein said stabilizing means have a transistor circuit wherein one end and other end are connected to said first power supply line, and a control terminal is connected to said internal node.

14. A digital-analog converter comprising:

a decoder that converts a plurality of bits of data to a plurality of digital signals;

a plurality of current cells each including a constant current supply, connected to a first power line, that outputs a constant current to an external node, a first switch that dumps current input from said constant current supply when a first selection signal is at an on level, via said internal node, to a second power supply line, a second switch that outputs current input from said constant current supply when a second selection signal is at an on level, via said internal node, a first selector that generates said first selection signal by inverting an input digital signal from said decoder, and which is driven by potential differences appearing between said internal node and said second power supply line, and a second selector that generates said second selection signal by inverting an inverted signal of the input digital signal, and which is driven by potential differences appearing between said internal node and said second power supply line, a potential of said internal node being set to be lower than a high level potential of the input signal and the inverted signal, so that said first switch and said second switch simultaneously assume an on state when a potential level of the input signal changes; and an output terminal that outputs a sum of the output currents of said current cells.

15. The digital-analog converter according to claim 14, wherein said constant current supply is a transistor circuit having one terminal connected to said first power supply line, another terminal connected to said internal node, and a control terminal coupled to a bias voltage.

16. The digital-analog converter according to claim 14, wherein said first switch has a transistor circuit having one terminal connected to said internal node, another terminal connected via a resistor to said second power supply line, and a control terminal coupled to said first selection signal.

17. The digital-analog converter according to claim 14, wherein said second switch has a transistor circuit having one terminal connected to said internal node, another terminal connected to a current output terminal, and a control terminal coupled to said second selection signal.

18. The digital-analog converter according to claim 14, wherein said first selector comprises an inverter including:

a first transistor of one conductive type, having one terminal connected to said internal node, and a control terminal which is coupled to the input digital signal; and a second transistor of another conductive type, having one terminal connected to said second power supply line, another terminal connected to another terminal of said first transistor, and a control terminal which is coupled to the input digital signal.

19. The digital-analog converter according to claim 14, wherein said first selector comprises a NAND gate including:

a first transistor of one conductive type, having one terminal connected to said internal node, and a control terminal which is coupled to the input digital signal;

a second transistor of the one conductive type, having one terminal connected to said internal node, and a slave terminal which is coupled to a slave signal;

a third transistor of another conductive type, having one terminal connected to said second power supply line, and a slave terminal which is coupled to the slave signal; and a fourth transistor of the another conductive type, having one terminal connected to another terminal of said third transistor, another terminal connected to another terminal of said first transistor and to another terminal of said second transistor, and a control terminal which is coupled to the input digital signal.

20. The digital-analog converter according to claim 14, wherein said second selector comprises an inverter including:

a first transistor of one conductive type, having one terminal connected to said internal node, and a control terminal which is coupled to the inverted signal; and a second transistor of another conductive type, having one terminal connected to said second power supply line, another terminal connected to another terminal of said first transistor, and a control terminal which is coupled to the inverted signal.

21. The digital-analog converter according to claim 14, wherein said second selector comprises a NAND gate including:

a first transistor of one conductive type, having one terminal connected to said internal node, and a control terminal which is coupled to the inverted signal;

a second transistor of the one conductive type, having one terminal connected to said internal node, and a slave terminal which is coupled to a slave signal;

a third transistor of another conductive type, having one terminal connected to said second power supply line, and a slave terminal which is coupled to the slave signal; and a fourth transistor of the another conductive type, having one terminal connected to another terminal of said third transistor, another terminal connected to another terminal of said first transistor and to another terminal of said second transistor, and a control terminal which is coupled to the input digital signal.

22. The digital-analog converter according to claim 14, further comprising a converter that generates the inverted signal based on the input digital signal, and which is driven by potential differences arising between said first power supply line and said second power supply line.

23. The digital-analog converter according to claim 22, comprising:

a first transistor of one conductive type, having one terminal connected to said first power supply line, and a control terminal which is coupled to the input digital signal; and a second transistor of another conductive type, having one terminal connected to said second power supply line, another terminal connected to another terminal of said first transistor, and a control terminal which is coupled to the input digital signal.

24. The digital-analog converter according to claim 14, further comprising a stabilizer that stabilizes potential at said internal node.

25. The digital-analog converter according to claim 24, wherein said stabilizer comprises a capacitor having one end connected to said internal node and another end connected to said second power supply line.

26. The digital-analog converter according to claim 24, wherein said stabilizing means have a transistor circuit wherein one end and other end are connected to said first power supply line, and a control terminal is connected to said internal node.

* * * * *